United States Patent
Lin

(10) Patent No.: US 12,396,308 B2
(45) Date of Patent: Aug. 19, 2025

(54) CIRCUIT SUBSTRATE AND TILED ELECTRONIC DEVICE

(71) Applicant: Innolux Corporation, Miao-Li County (TW)

(72) Inventor: Chun-Hsien Lin, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 614 days.

(21) Appl. No.: 17/727,827

(22) Filed: Apr. 25, 2022

(65) Prior Publication Data

US 2022/0384697 A1    Dec. 1, 2022

(30) Foreign Application Priority Data

May 25, 2021   (CN) .......................... 202110573577.1

(51) Int. Cl.
| | |
|---|---|
| *H10H 20/85* | (2025.01) |
| *G09F 9/30* | (2006.01) |
| *G09F 9/302* | (2006.01) |
| *G09G 3/32* | (2016.01) |
| *H10H 20/857* | (2025.01) |
| *H10H 29/14* | (2025.01) |

(52) U.S. Cl.
CPC ......... *H10H 20/857* (2025.01); *G09F 9/3026* (2013.01); *G09G 3/32* (2013.01); *H10H 29/142* (2025.01); *G09G 2310/0275* (2013.01)

(58) Field of Classification Search
CPC .......... G09F 9/3026; G09G 2310/0275; G09G 2300/026; G09G 2300/0426; G09G 2300/08; G06F 3/1446; H01L 25/0753; H01L 33/62; H05K 1/0298
See application file for complete search history.

(56) References Cited

FOREIGN PATENT DOCUMENTS

| | | | |
|---|---|---|---|
| CN | 107976849 | | 5/2018 |
| CN | 107976849 A | * | 5/2018 |

(Continued)

OTHER PUBLICATIONS

"Office Action of China Counterpart Application", issued on Mar. 8, 2024, p. 1-p. 8.

(Continued)

*Primary Examiner* — Joshua Benitez Rosario
*Assistant Examiner* — Moataz Khalifa
(74) *Attorney, Agent, or Firm* — JCIPRNET

(57) ABSTRACT

An embodiment of the disclosure provides a circuit substrate and a tiled electronic device. The circuit substrate includes a substrate and first to third metal layers. The first metal layer is disposed on the substrate and includes first and second connection lines, and first and second scan lines. The first and second connection lines are electrically connected to the first and second scan lines, respectively. The second scan line includes two separate line segments respectively located at opposite sides of the first connection line. The second metal layer is disposed on the substrate and includes a first data line. The first data line is overlapped with the first connection line. The third metal layer is disposed on the substrate and includes a bridge line. The bridge line is electrically connected to the line segments. The second metal layer is disposed between the first and third metal layers.

20 Claims, 8 Drawing Sheets

(56) References Cited

FOREIGN PATENT DOCUMENTS

| CN | 110428784 | | 11/2019 | | |
|---|---|---|---|---|---|
| CN | 113130583 | A * | 7/2021 | ………… | G09G 3/3233 |
| KR | 20220030467 | A * | 3/2022 | | |
| KR | 20220156719 | A * | 11/2022 | | |
| WO | WO-2016107014 | A1 * | 7/2016 | ………… | G06F 3/1423 |
| WO | WO-2020192284 | A1 * | 10/2020 | ………… | G09G 3/2092 |

OTHER PUBLICATIONS

"Office Action of Taiwan Counterpart Application", issued on Mar. 20, 2024, p. 1-p. 6.

* cited by examiner

CIRCUIT SUBSTRATE AND TILED ELECTRONIC DEVICE

CROSS-REFERENCE TO RELATED APPLICATION

This application claims the priority benefit of China application serial no. 202110573577.1, filed on May 25, 2021. The entirety of the above-mentioned patent application is hereby incorporated by reference herein and made a part of this specification.

BACKGROUND

Technical Field

An embodiment of the disclosure relates to a substrate and an electronic device, and more particularly, to a circuit substrate and a tiled electronic device formed by tiling a plurality of circuit substrates.

Description of Related Art

In a general display electronic device, the driving circuit is an important driving element. However, the current driving elements are all disposed in the frame area at two sides of the circuit substrate, occupying the frame space at two sides of the electronic device and making the frame have a considerable width, which is not conducive to a narrow frame, a very narrow frame, or a frameless display electronic device design. Therefore, the research and development of electronic devices need to be continuously updated and adjusted.

SUMMARY

The disclosure is directed to a circuit substrate that may provide a large tiling display technique.

The disclosure is directed to a tiled electronic device having good display quality or display effect.

According to an embodiment of the disclosure, the display device includes a substrate, a first metal layer, a second metal layer, and a third metal layer. The first metal layer is disposed on the substrate and includes a first connection line and a second connection line extended along a first direction, and a first scan line and a second scan line extended along a second direction. The first connection line is electrically connected to the first scan line. The second connection line is electrically connected to the second scan line. The second scan line includes two separate line segments respectively located at two opposite sides of the first connection line. The second metal layer is disposed on the substrate and includes a first data line extended along the first direction. The first data line is overlapped with the first connection line. The third metal layer is disposed on the substrate and includes a bridge line extended along the second direction. The bridge line is electrically connected to the two separate line segments of the second scan line. The second metal layer is disposed between the first metal layer and the third metal layer.

According to an embodiment of the disclosure, the tiled electronic device includes a plurality of the circuit substrates, and the plurality of circuit substrates are tiled to each other. A number of the plurality of circuit substrates is 2 times N, and N is a positive integer.

Based on the above, in the circuit substrate and the tiled electronic device formed by tiling a plurality of circuit substrates according to an embodiment of the disclosure, since the gate driving circuit and the data driving circuit of the circuit substrate may be disposed at the same side of the substrate and connected to the scan lines via the connection lines, the gate driving circuit for providing a scan signal and the data driving circuit for providing a data signal may be centrally disposed in the peripheral area at the same side of the substrate. In this way, the transmittance of the display area of the circuit substrate may be improved or a transparent display technique may be provided. In addition, since the driving circuits are concentrated at the same side of the circuit substrate, when a plurality of circuit substrates are tiled, a plurality of display areas may be tiled adjacently to provide a large display tiling technique with narrow frame, very narrow frame, or borderless tiling. Thereby, the circuit substrate and the tiled electronic device formed by tiling a plurality of circuit substrates have good display quality or display effect.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
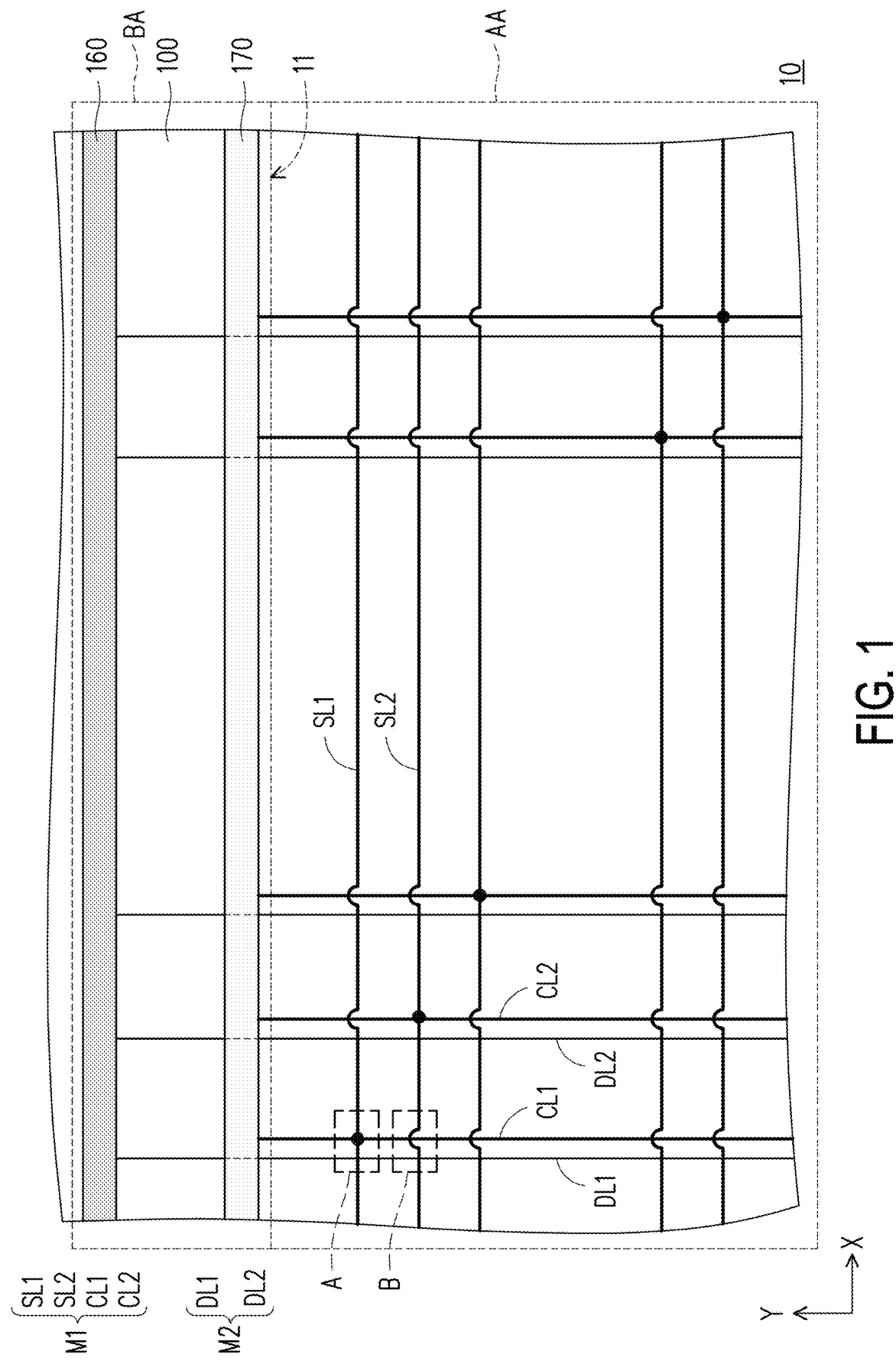
FIG. 1 is a schematic top view of the circuit of a circuit substrate of an embodiment of the disclosure.

The disclosure may be understood by referring to the following detailed description in conjunction with the accompanying drawings. It should be noted that in order to facilitate understanding to the reader and to simplify the drawings, the plurality of drawings in the disclosure depict a part of the electronic device, and certain elements in the drawings are not drawn to actual scale. In addition, the number and size of each element in the figures are for illustration, and are not intended to limit the scope of the disclosure.

Certain terms are used throughout the specification and the appended claims of the disclosure to refer to particular elements. Those skilled in the art should understand that electronic equipment manufacturers may refer to the same elements under different names. This article is not intended to distinguish between elements having the same function but different names. In the following description and claims, the words "including", "containing", "having" and the like are open words, so they should be interpreted as meaning "including but not limited to . . . " Therefore, when the terms "including", "containing", and/or "having" are used in the description of the disclosure, they specify the presence of corresponding features, areas, steps, operations, and/or components, but do not exclude the presence of one or more corresponding features, areas, steps, operations, and/or components.

The terminology mentioned in the specification, such as: "up", "down", "front", "rear", "left", "right", etc., are directions referring to the drawings. Therefore, the directional terms used are used for illustration, not for limiting the disclosure. In the drawings, each drawing depicts general features of methods, structures, and/or materials used in specific embodiments. However, these drawings should not be construed to define or limit the scope or nature covered by these embodiments. For example, for clarity, the relative size, thickness, and location of each film, area, and/or structure may be reduced or enlarged.

It should be understood that when a component or film layer is referred to as being "connected to" another component or film layer, it may be directly connected to this other component or film layer, or there may be an intervening component or film layer between the two. When a component is said to be "directly connected to" another component or film layer, there is no intervening component or film layer between the two. Moreover, when a component is said to be "coupled to another component (or a variant thereof)", it may be directly connected to this other component, or indirectly connected (for example, electrically connected) to this other component via one or a plurality of components.

The terms "about", "equal to", "equal" or "identical", "substantially" or "roughly" are generally interpreted as being within 20% of a given value or range, or interpreted as being within 10%, 5%, 3%, 2%, 1%, or 0.5% of a given value or range.

When one structure (or layer, component, substrate) in the disclosure is described to be located on another structure (or layer, component, substrate), it may mean that the two structures are adjacent and directly connected, or it may mean that the two structures are adjacent but not directly connected, and indirect connection means that there is at least one intermediate structure (or intermediate layer, intermediate component, intermediate substrate, intermediate spacing) between the two structures. The lower surface of one structure is adjacent or directly connected to the upper surface of the intermediate structure, the upper surface of the other structure is adjacent or directly connected to the lower surface of the intermediate structure, and the intermediate structure may be formed by a single-layer or multi-layer physical structure or non-physical structure without limitation. In the disclosure, when a certain structure is disposed "on" another structure, it may mean that a certain structure is "directly" on the other structure, or that a certain structure is "indirectly" on the other structure. That is, at least one structure is further sandwiched between the certain structure and the other structure.

The "first", "second" . . . etc. in the specification of the disclosure may be used herein to describe various elements, components, regions, layers, and/or portions. However, these elements, components, regions, and/or portions should not be limited by these terms. These terms are used to distinguish one element, component, area, layer, or portion from another element, component, area, layer, or portion. Therefore, the "first element", "component", "area", "layer", or "portion" discussed below are used to distinguish from "second element", "component", "area", "layer", or "portion", and are not used to limit the order or a specific element, component, area, layer, and/or portion.

According to an embodiment of the disclosure, optical microscopy (OM), scanning electron microscope (SEM), film thickness profile measuring instrument (α-step), ellipsometer, or other suitable methods may be used to measure the width, thickness, height, or area of each element, or the distance or spacing between elements, but the disclosure is not limited thereto. Specifically, according to some embodiments, an SEM may be used to obtain a cross-sectional structure image containing the element to be measured, and the width, thickness, height, or area of each element, or the distance or spacing between elements may be measured, and the volume of the element may be obtained via a suitable method (for example: integration). In addition, there may be a certain error in any two values or directions for comparison.

The electronic device may have better bonding quality via the light-emitting module or light-emitting device of an embodiment of the disclosure, wherein the electronic device may include a display device, an antenna device, a sensing device, a tiled device, or a transparent display device, but the disclosure is not limited thereto. The electronic device may be a rollable, stretchable, bendable, or flexible electronic device. The electronic device may include, for example, a liquid crystal, a light-emitting diode (LED), a quantum dot (QD), a fluorescence, a phosphor, or other suitable materials, and the materials thereof may be arbitrarily arranged and combined, or other suitable display media, or a combination of the above. The LED may include, for example, an organic light-emitting diode (OLED), a mini LED, a micro LED, or a quantum dot (QD) LED (such as QLED), but the disclosure is not limited thereto. The antenna device may be, for example, a liquid-crystal antenna, but the disclosure is not limited thereto. The tiled device may be, for example, a display tiled device or an antenna tiled device, but the disclosure is not limited thereto. It should be noted that the electronic device may be any combination of the above, but the disclosure is not limited thereto. In addition, the appearance of the electronic device may be rectangular, circular, polygonal, a shape with a curved edge, or other suitable shapes. The electronic device may have a peripheral system such as a driving system, a control system, a light source system, a shelf system, etc., to support a display device, an antenna device, or a tiled device. Hereinafter, the content of the disclosure will be described by using a circuit substrate or a tiled electronic device, but the disclosure is not limited thereto.

It should be noted that in the following embodiments, the features in several different embodiments may be replaced, recombined, and mixed to complete other embodiments without departing from the spirit of the disclosure. As long as the features between the embodiments do not violate the spirit of the disclosure or conflict each other, they may be mixed and used arbitrarily.

Hereinafter, reference will be made in detail to exemplary embodiments of the disclosure, and examples of the exemplary embodiments are illustrated in the figures. Wherever possible, the same reference numerals are used in the figures and the descriptions to refer to the same or similar portions.

Figure 2:
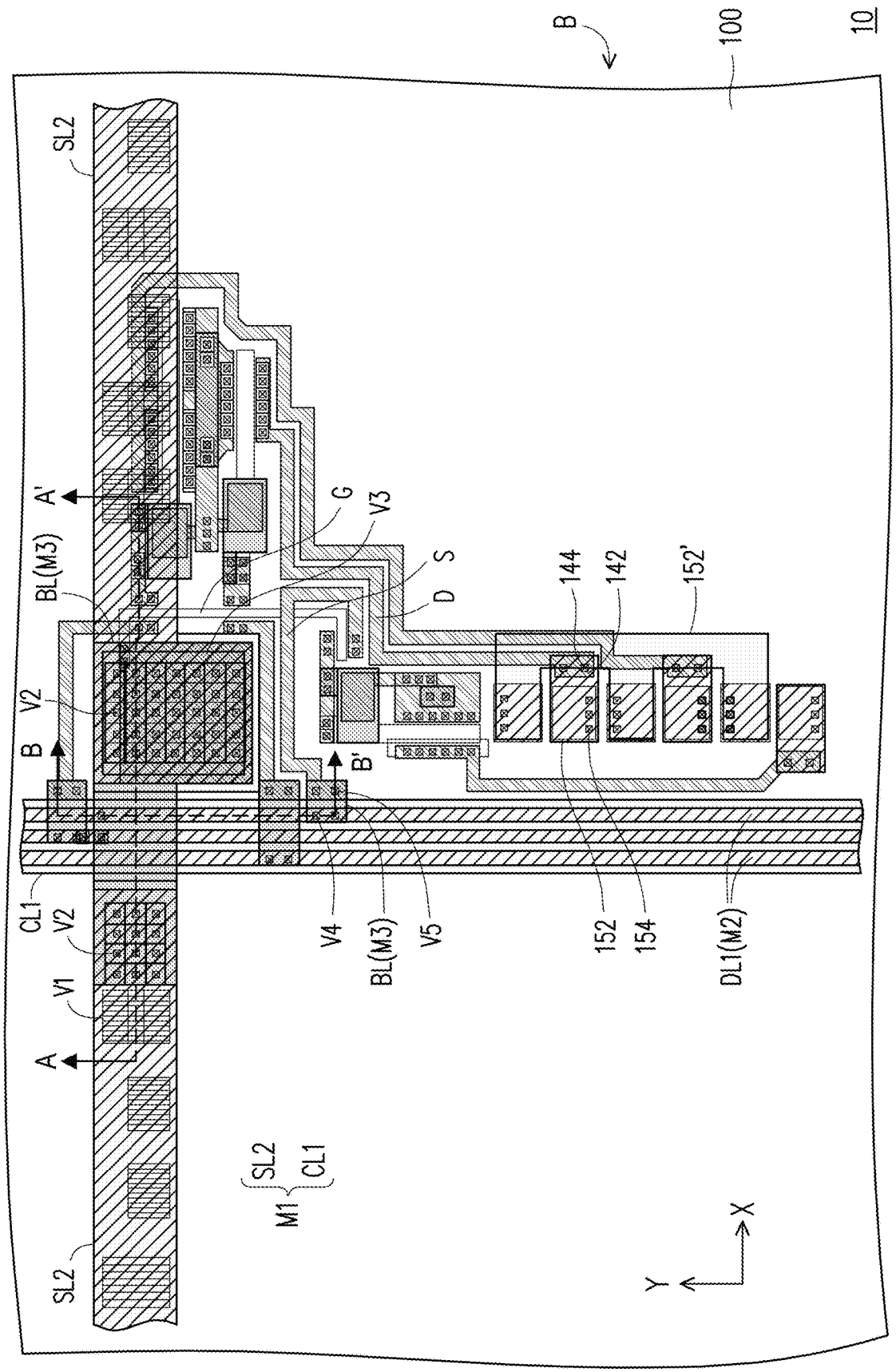
FIG. 2 is a partially enlarged schematic top view of a circuit substrate of an embodiment of the disclosure.
Figure 3:
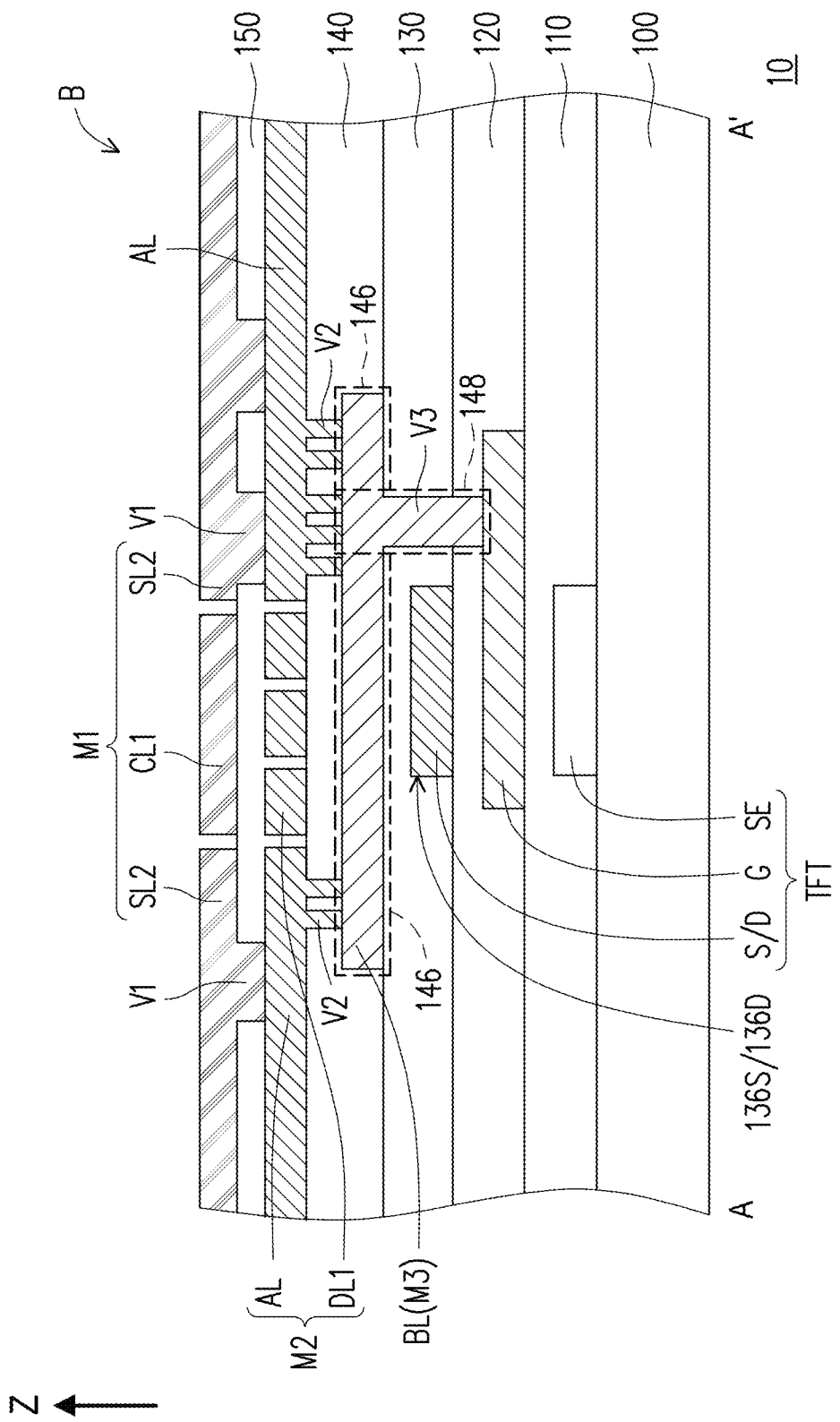
FIG. 3 is a schematic cross-sectional view of the circuit substrate of FIG. 2 along section line A-A'.
Figure 4:
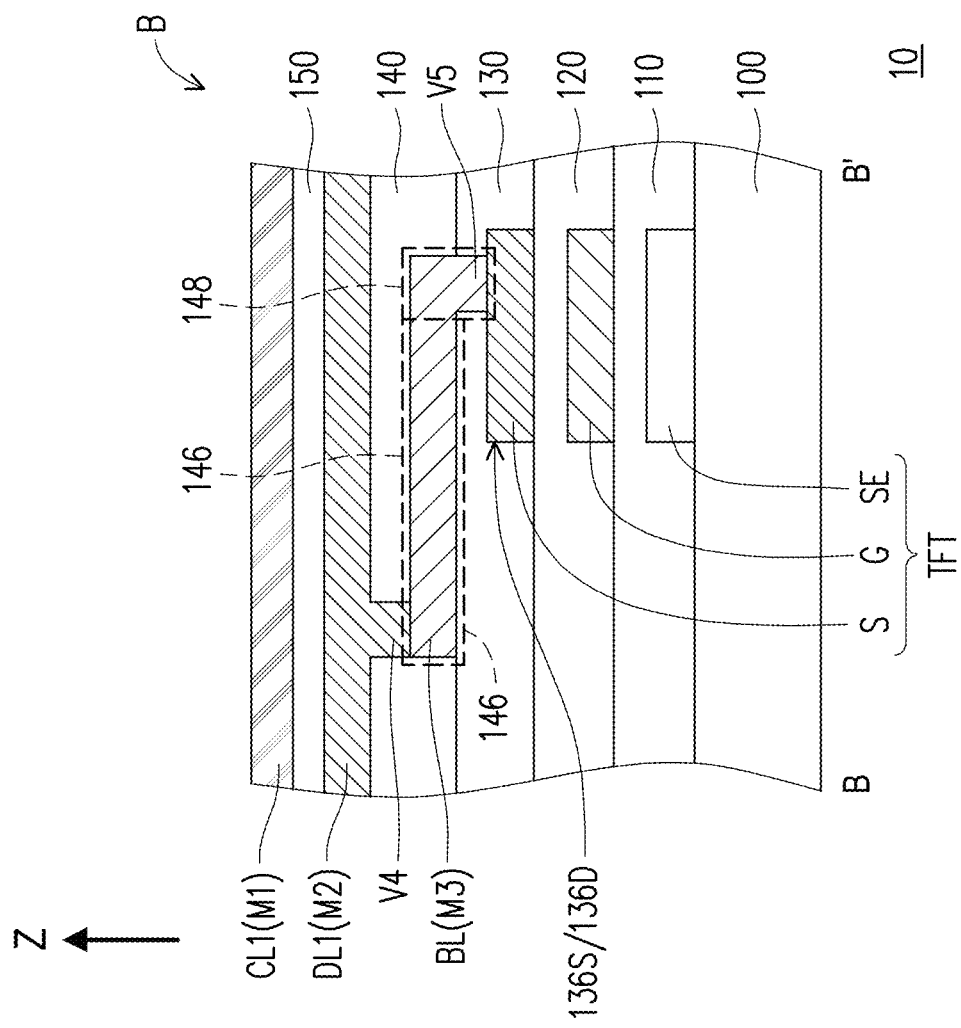
FIG. 4 is a schematic cross-sectional view of the circuit substrate of FIG. 2 along section line B-B'.
Figure 5:
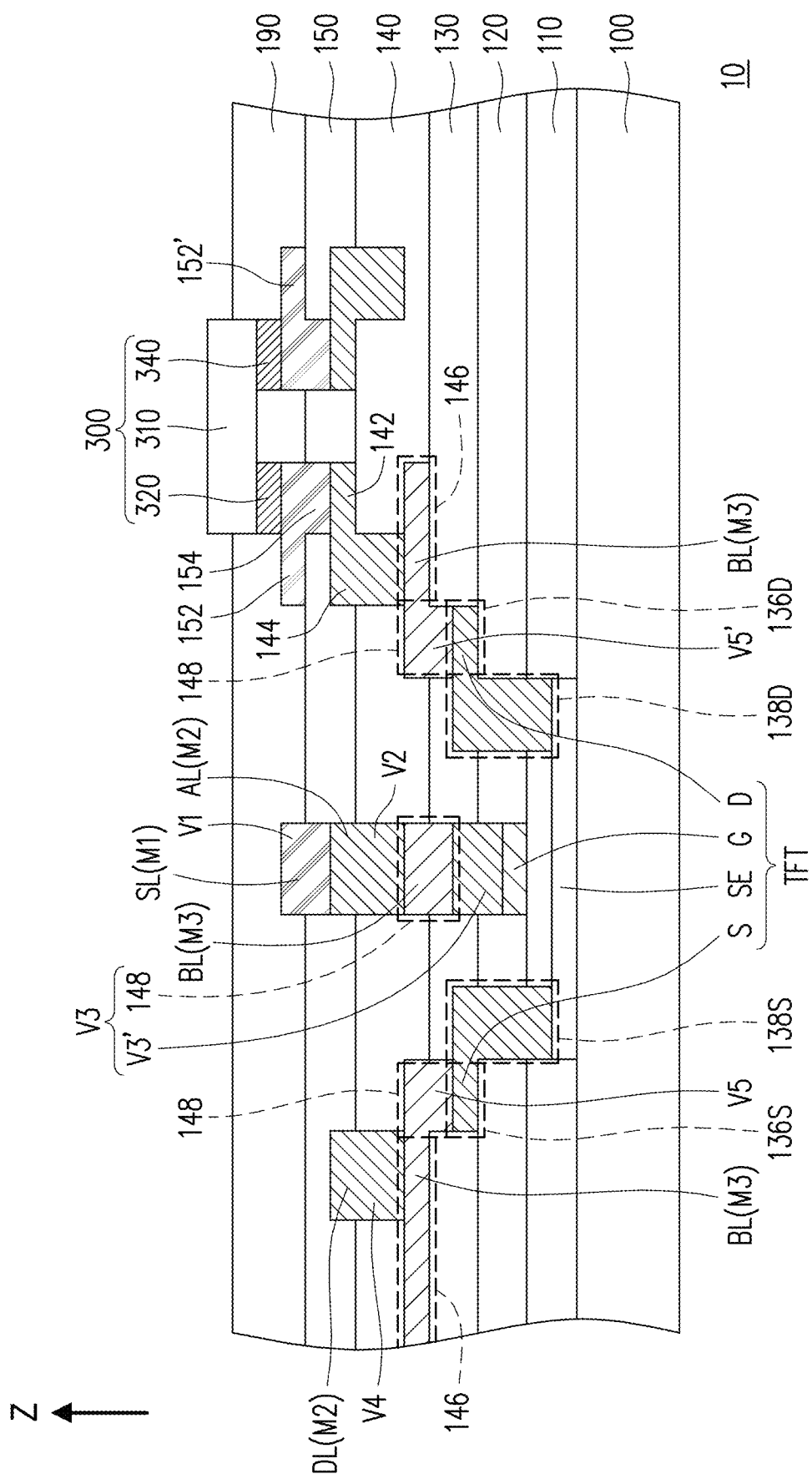
FIG. 5 is a schematic cross-sectional view of an active element and a light-emitting element of a circuit substrate of an embodiment of the disclosure.
Figure 8:
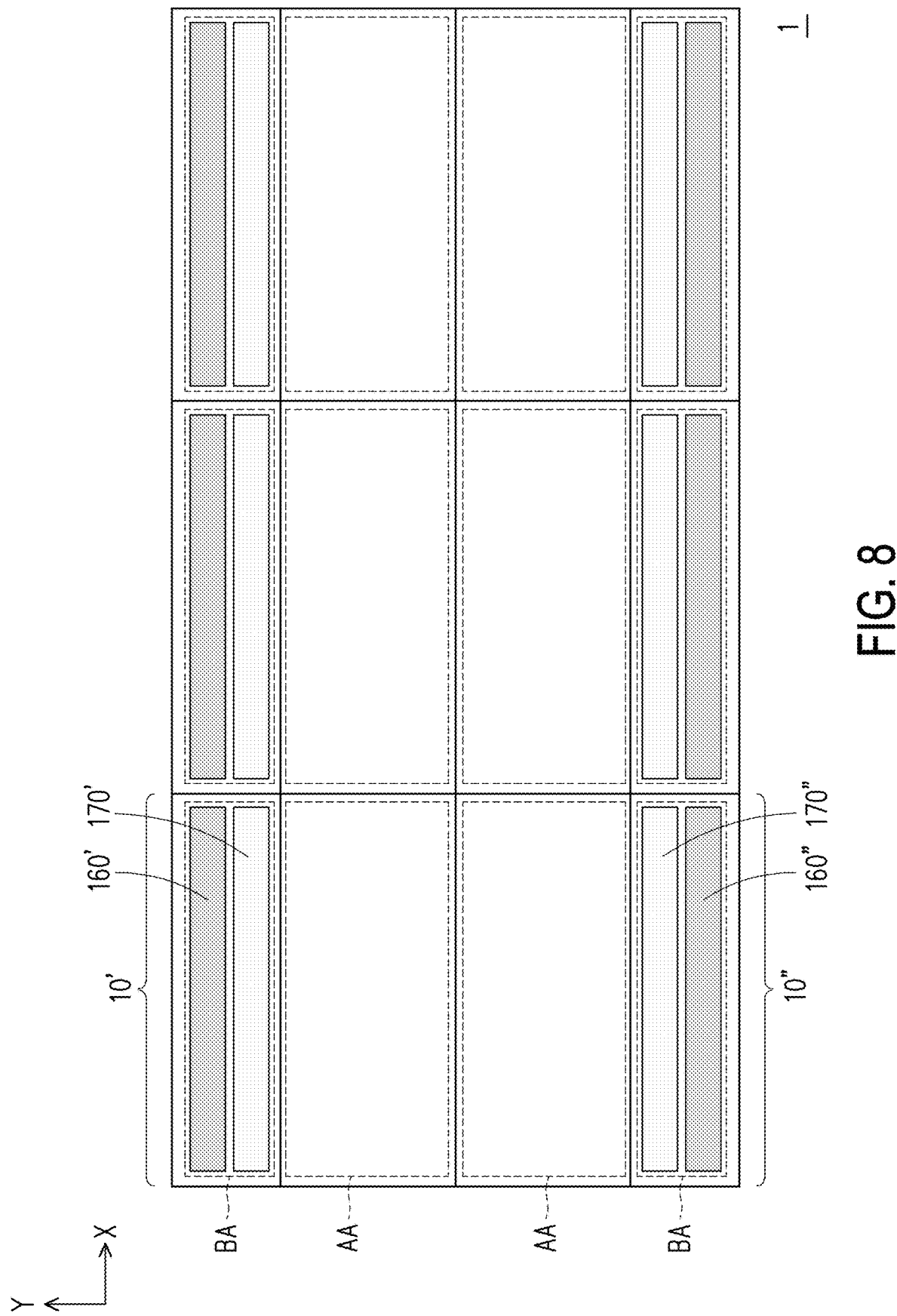
FIG. 8 is a schematic top view of a tiled electronic device of an embodiment of the disclosure.

FIG. 1 is a schematic top view of the circuit of a circuit substrate of an embodiment of the disclosure. For clarity of the drawings and convenience of description, several elements are omitted in FIG. 1. Referring to FIG. 1, in an embodiment of the disclosure, a circuit substrate 10 is, for example, an active element substrate, a passive element substrate, a printed circuit board (PCB), a chip-on-film (COF), or any other type of circuit board. In some embodiments, the circuit substrate 10 includes a substrate 100 and a patterned circuit of a plurality of metal layers disposed on the substrate 100 and a driving circuit (including a gate driving circuit 170 and a data driving circuit 160). The multi-layer metal layer includes a first metal layer M1, a second metal layer M2, and a third metal layer M3 (as shown in FIG. 2, FIG. 3, or FIG. 4). The first metal layer M1 includes a first connection line CL1 and a second connection line CL2 extended along a first direction (also referred to as Y-axis). The first metal layer M1 further includes a first scan line SL1 and a second scan line SL2 extended along a second direction (also referred to as X-axis). In an embodiment of the disclosure, the first direction is perpendicular to the second direction (Y-axis is perpendicular to X-axis), and the third direction (Z-axis as shown in FIG. 3 or FIG. 4, which is the normal direction of the substrate 100) is perpendicular to the first direction or the second direction. The first connection line CL1 is electrically connected to the first scan line SL1, and the second connection line CL2 is electrically connected to the second scan line SL2. In some embodiments, the second metal layer M2 includes a first data line DL1 extended along the first direction. In some embodiments, a plurality of light-emitting elements 300 (as shown in FIG. 5) may be further disposed on the circuit substrate 10 to be electrically connected to the data lines, the scan lines, and the driving circuits. As shown in FIG. 1, the gate driving circuit 170 and the data driving circuit 160 of the circuit substrate 10 of an embodiment of the disclosure may be disposed at the same side of the substrate 100. As a result, the gate driving circuit 170 for providing a scan signal and the data driving circuit 160 for providing a data signal may be centrally disposed in a peripheral area BA (also referred to as a non-display area) at the same side of the substrate 100. Therefore, the transmittance of a display area AA of the circuit substrate 10 may be improved or a transparent display technique may be provided. In addition, since the driving circuits are concentrated at the same side of the circuit substrate 10 (as shown in FIG. 8), when a plurality of circuit substrates 10 are tiled, a plurality of the display area AA may be tiled adjacently to provide a large display tiling technique of narrow frame, very narrow frame, or borderless tiling. Thereby, the circuit substrate 10 and a tiled electronic device 1 (as shown in FIG. 8) formed by tiling a plurality of the circuit substrate 10 have good display quality or display effect.

In detail, the circuit substrate 10 may be a matrix substrate or a backplane of a display panel, and the circuit substrate 10 and the light-emitting elements 300 form a display panel. The display panel may include a liquid-crystal display (LCD), an organic light-emitting diode (OLED), a micro-LED display, a mini-LED display, a QD LED display, or an electronic paper display (EPD). In some embodiments, the circuit substrate 10 is, for example, a display panel adopting a light-emitting diode technique. The circuit substrate 10 is, for example, a flexible, stretchable, or rigid display panel. The substrate 100 includes a rigid substrate, a flexible substrate, or a combination of the above. For example, the substrate 100 includes glass, quartz, sapphire, acrylic resin, polycarbonate (PC), polyimide (PI), polyethylene terephthalate (PET), other suitable transparent materials, or a combination of the above, but the disclosure is not limited thereto.

In an embodiment of the disclosure, the plurality of metal layers of the circuit substrate 10 may form a pixel circuit. The pixel circuit may form an active matrix by connecting a plurality of thin-film transistors (TFTs). In some embodiments, the circuit substrate 10 has the peripheral area BA and the display area AA. The peripheral area BA is disposed at a side of the display area AA. For example, the peripheral area BA may be disposed at a first side 11 of the display area AA and located outside the display area AA. The display area AA may be defined as an area where the active matrix is disposed on the substrate 100 and is used as an area for displaying an image. The peripheral area BA may be defined as an area outside the display area AA where no active matrix is disposed, and is used for disposing a peripheral circuit or a driving circuit.

In some embodiments, the pixel circuit of the circuit substrate 10 may also form a matrix without being connected to the TFTs. Under the above configuration, the pixel circuit may be called a passive matrix. The area having the passive matrix may still be called the display area and is used to display an image.

The circuit substrate 100 of an embodiment of the disclosure may be applied to an electronic device, wherein the electronic device includes a mobile device, a digital camera, a portable computer, a tabletop computer, a television, an automotive display, a portable CD player, a tiling panel, an outdoor large display, or any device including image display function, but the disclosure is not limited thereto.

As shown in FIG. 1, a plurality of driving circuits and a plurality of circuits are disposed on the substrate 100. The data driving circuit 160 and the gate driving circuit 170 are respectively disposed in the peripheral area BA extended along the second direction (i.e., X-axis), and are disposed close to the first side 11 of the display area AA, but the disclosure is not limited thereto. In other embodiments, the peripheral area BA may be located at any side of the display area AA. In some embodiments, the gate driving circuit 170 may be disposed between the data driving circuit 160 and the display area AA, but the disclosure is not limited thereto. In some other embodiments, the data driving circuit 160 may be disposed between the gate driving circuit 170 and the display area AA. The data driving circuit 160 may provide a data signal transmitted to the light-emitting elements 300 via a pixel circuit or a matrix. The gate driving circuit 170 may provide a scan signal and drive the light-emitting elements 300 to display an image via a pixel circuit or a matrix.

A plurality of data lines DL1 and DL2 are electrically connected to the data driving circuit 160 and extended from the peripheral area BA into the display area AA along the first direction (i.e., Y-axis). The plurality of data lines include the first data line DL1 and the second data line DL2. The first data line DL1 and the second data line DL2 are arranged in parallel in the second direction (i.e., X-axis). From another perspective, the first data line DL1 and the second data line DL2 are arranged in a plurality of columns in the longitudinal direction of the circuit substrate 10. In some embodiments, the first data line DL1 and the second data line DL2 may be respectively overlapped and disposed across the gate driving circuit 170, but the disclosure is not limited thereto. It should be noted here that FIG. 1 schematically shows five data lines, but the number of data lines of the disclosure depends on design requirements, and is not limited to the number shown. For example, the number of data lines may be one or a plurality, including less than five or more than five. In some embodiments, the first data line DL1 and the second data line DL2 are formed by patterning the second metal layer M2, for example. The material of the second metal layer M2 may include molybdenum (Mo), titanium (Ti), tantalum (Ta), niobium (Nb), hafnium (Hf), nickel (Ni), chromium (Cr), cobalt (Co), zirconium (Zr), tungsten (W), aluminum (Al), silver (Ag), aurum (Au), or other suitable metals, or an alloy or a combination of the above materials, but the disclosure is not limited thereto.

The plurality of scan lines SL1 and SL2 are disposed in the display area AA and extended in the display area AA along the second direction (i.e., X-axis). The plurality of scan lines include the first scan line SL1 and the second scan line SL2. The first scan line SL1 and the second scan line SL2 are arranged in parallel in the first direction (i.e., Y-axis). From another perspective, the first scan line SL1 and the second scan line SL2 are arranged in a plurality of horizontal rows in the lateral direction of the circuit substrate 10. In some embodiments, the first scan line SL1 and the second scan line SL2 may be staggered or disposed across the first data line DL1 and the second data line DL2, but not limited thereto. It should be noted here that FIG. 1 schematically shows five scan lines, but the number of scan lines of the disclosure depends on design requirements, and is not limited to the number shown. For example, the number of scan lines may be one or a plurality, including less than five or more than five. In some embodiments, the first scan line SL1 and the second scan line SL2 are formed by patterning the first metal layer M1, for example. The material of the first metal layer M1 may be similar to the material of the second metal layer M2, and is therefore not repeated herein.

In some embodiments, the first metal layer M1 may also be patterned to form a plurality of connection lines CL1 and CL2 extended along the first direction. Specifically, the first connection line CL1 and the second connection line CL2 are electrically connected to the gate driving circuit 170 and extended from the peripheral area BA into the display area AA along the first direction (i.e., Y-axis). The first connection line CL1 and the second connection line CL2 are arranged in parallel in the second direction (that is, X-axis). In some embodiments, the connection lines are overlapped with the data lines. For example, the first data line DL1 is overlapped with the first connection line CL1. The second data line DL2 is overlapped with the second connection line CL2. It should be noted here that, for the sake of clarity and convenience of description of the drawings, FIG. 1 shows the circuit diagram of the first connection line CL1 and the first data line DL1 as two non-overlapped circuits. However, according to design requirements, the first data line DL1 may be overlapped with the first connection line CL1. The second data line DL2 may be overlapped with the second connection line CL2. In other embodiments, the first data line DL1 may also be laterally separated without being overlapped with the first connection line CL1. In an embodiment of the disclosure, overlap may be defined as the orthographic projection of one element on the substrate 100 overlapping with the orthographic projection of another element on the substrate 100. Under the above configuration, similar to the first data line DL1 and the second data line DL2, the first connection line CL1 and the second connection line CL2 may be arranged in a plurality of columns in the longitudinal direction of the circuit substrate 10. It should be noted here that FIG. 1 schematically shows five scan lines, but the number of scan lines of the disclosure depends on design requirements, and is not limited to the number shown. For example, the number of connection lines may be one or a plurality, including less than five or more than five.

It should be mentioned that, in the display area AA, the first connection line CL1 is electrically connected to the first scan line SL1, and the second connection line CL2 is electrically connected to the second scan line SL2. Thereby, the gate driving circuit 170 may be electrically connected to the first scan line SL1 and the second scan line SL2 via the first connection line CL1 and the second connection line CL2, respectively. Thereby, the gate driving circuit 170 may respectively input the provided scan signal to the first scan line SL1 and the second scan line SL2 via the first connection line CL1 and the second connection line CL2. In this way, the scan signal is transmitted in the second direction (X-axis) along the first scan line SL1 and the second scan line SL2. In addition, the data driving circuit 160 may be electrically connected to the first data line DL1 and the second data line DL2 to respectively input the provided data signal to the first data line DL1 and the second data line DL2. In this way, the data signal is transmitted in the first direction (Y-axis) along the first data line DL1 and the second data line DL2. Under the above configuration, the data driving circuit 160 and the gate driving circuit 170 in the peripheral area BA located at the first side 11 of the display area AA may drive the pixel circuits or the TFTs of the matrix in the display area AA at the same side of the substrate 100, so that the light-emitting elements 300 (as shown in FIG. 5) connected to the TFTs in the display area AA display an image. Since the driving circuit is disposed outside the display area AA, the transmittance of the display area AA of the circuit substrate 10 may be improved or a transparent display technique may be provided. In addition, since the driving circuits are concentrated at the same side of the circuit substrate 10, the arrangement of the peripheral area BA may be reduced to achieve a narrow frame, a very narrow frame, or a frameless design. In addition, when a plurality of circuit substrates 10 are tiled, a plurality of display areas AA may be tiled adjacently to provide a large display tiling technique with narrow frame, very narrow frame, or borderless tiling. Thereby, the circuit substrate 10 has good display quality or display effect.

Hereinafter, a partial enlarged schematic diagram of the circuit of the circuit substrate 10 is further used to illustrate the arrangement structure of the circuits and the TFTs.

Figure 6:
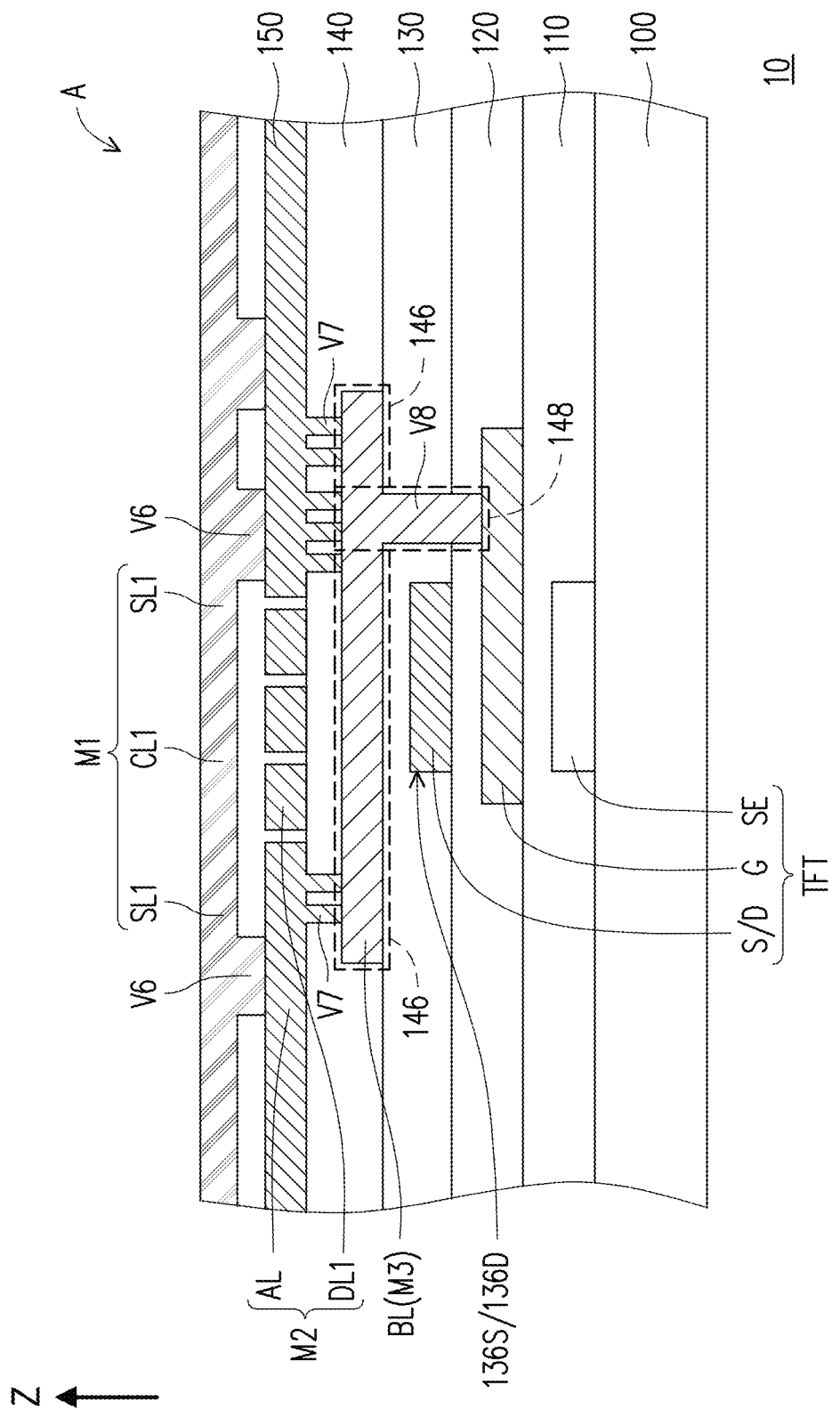
FIG. 6 is a schematic cross-sectional view of a circuit substrate of an embodiment of the disclosure.

FIG. 2 is a partially enlarged schematic top view of a circuit substrate of an embodiment of the disclosure. FIG. 3 is a schematic cross-sectional view of the circuit substrate of FIG. 2 along section line A-A'. FIG. 4 is a schematic cross-sectional view of the circuit substrate of FIG. 2 along section line B-B'. FIG. 5 is a schematic cross-sectional view of an active element and a light-emitting element of a circuit substrate of an embodiment of the disclosure. FIG. 6 is a schematic cross-sectional view of a circuit substrate of an embodiment of the disclosure. For clarity of the drawings and convenience of description, several elements are omitted in FIG. 2 to FIG. 6. Please refer to FIG. 2, FIG. 3, and FIG. 4 first. FIG. 2, FIG. 3, and FIG. 4 show a partial enlarged structure of an area B of FIG. 1. In some embodiments, a plurality of insulating layers and TFTs are disposed on the substrate 100. In detail, the TFTs include a semiconductor layer SE, a gate G, a source S, and a drain D. In some embodiments, the semiconductor layer SE is disposed on the substrate 100. In other embodiments, a buffer layer may be disposed between the semiconductor layer SE and the substrate 100, but the disclosure is not limited thereto. The material of the semiconductor layer SE is, for example, low-temperature polysilicon (LTPS) or amorphous silicon, but the disclosure is not limited thereto. In other embodiments, the material of the semiconductor layer SE includes amorphous silicon, polysilicon, monocrystalline silicon, germanium (Ge), or other suitable compound semiconductors or other suitable alloy semiconductors. Compound semiconductors may include gallium nitride (GaN), silicon carbide (SiC), gallium arsenide (GaAs), gallium phosphide (GaP), indium phosphide (InP), indium arsenide (InAs), and/or indium antimonide (InSb). The alloy semiconductor may include SiGe alloy, GaAsP alloy, AlInAs alloy, AlGaAs alloy, GaInAs alloy, GaInP alloy, GaInAsP alloy, or a combination of the above. In other embodiments, the material of the semiconductor layer SE further includes cadmium telluride (CdTe) or cadmium sulfide (CdS). The material of the semiconductor layer SE may also include, but not limited to, metal oxide, for example, indium gallium zinc oxide (IGZO), indium zinc oxide (IZO), indium gallium zinc oxide (IGZTO), or an organic semiconductor containing a polycyclic aromatic compound, or a combination of the above. In some embodiments, the semiconductor layer SE may be doped with a p-type or n-type dopant.

As shown in FIG. 3, FIG. 4, and FIG. 5, a plurality of insulating layers 110, 120, 130, 140, and 150 are disposed on the semiconductor layer SE. For example, the gate insulating layer 110 is disposed on and covers the semiconductor layer SE. The gate insulating layer 110, the insulating layer 120, the insulating layer 130, the insulating layer 140, and the insulating layer 150 may have a single-layer or multi-layer structure, and the material thereof includes an organic material, an inorganic material, or a combination of the above. The organic material may include polyethylene terephthalate (PET), polyethylene (PE), polyethersulfone (PES), polycarbonate (PC), polymethylmethacrylate (PMMA), polyimide (PI), photo sensitive polyimide (PSPI), or a combination of the above, and the inorganic material may include silicon nitride (SiNx), silicon oxide (SiOy), silicon oxynitride, or a combination of the above, but the disclosure is not limited thereto.

The gate G is disposed on the gate insulating layer 110. The gate G is, for example, a pattern formed by patterning a fifth metal layer, but the disclosure is not limited thereto. The material of the fifth metal layer or the gate G may be similar to the material of the first metal layer M1, and is therefore not repeated herein.

The insulating layer 120 is disposed on the gate G, and the insulating layer 130 is disposed on the insulating layer 120. The insulating layer 120 and the insulating layer 130 may be penetrated by a conductive via V3 (please refer to FIG. 5 and FIG. 6), but the disclosure is not limited thereto. In an embodiment of the disclosure, the conductive via V3 penetrating the insulating layer 120 and the insulating layer 130 means that the insulating layer 120 and the insulating layer 130 have the conductive via V3. In the subsequent paragraphs of the present specification, the definition of other conductive vias is also similar to the definition of the above conductive via V3 and so on, and therefore is not repeated in the subsequent paragraphs.

The source S and the drain D are disposed on the insulating layer 130. The source S and the drain D are, for example, patterns formed by patterning a fourth metal layer, but the disclosure is not limited thereto. As shown in FIG. 5, the source S and the drain D may respectively include pad portions 136S/136D and via portions connected to the pad portions 136S/136D (shown in FIG. 5, via portions 138S/138D). The pad portions 136S/136D are formed on the surface of the insulating layer 120. A portion of the via portions 138S/138D may penetrate the gate insulating layer 110 and the insulating layer 120 to be electrically connected to the semiconductor layer SE, but the disclosure is not limited thereto. The material of the fourth metal layer or the source S and the drain D may be similar to the material of the first metal layer M1, and is therefore not repeated herein.

As shown in FIG. 2, FIG. 3, FIG. 4, and FIG. 5, the circuit substrate 10 further includes a third metal layer M3 disposed on the substrate 100. Specifically, the third metal layer M3 includes a bridge line BL extended along the second direction and disposed on the insulating layer 130. The bridge line BL includes a pad portion 146 and a via portion 148 connected to the pad portion 146. The pad portion 146 is formed on the surface of the insulating layer 130. As shown in FIG. 2, FIG. 3, and FIG. 5, the via portion 148 of the bridge line BL includes, for example, the conductive via V3 penetrating the insulating layer 120 and the insulating layer 130. A portion of the via portion 148 (i.e., the conductive via V3) penetrates the insulating layer 120 and the insulating layer 130 to be electrically connected to the gate G of the fifth metal layer. In some embodiments, the conductive via V3 may be formed by the via portion 148 of the bridge line BL and a conductive via V3' patterned in the fourth metal layer, so that the bridge line BL is connected to the gate G via the fourth metal layer, but the disclosure is not limited thereto. As shown in FIG. 2, FIG. 4, and FIG. 5, the bridge line BL may be electrically connected to the source S of the TFTs via a conductive via V5 (i.e., the via portion 148) penetrating the insulating layer 130. As shown in FIG. 5, the bridge line BL may be electrically connected to the drain D of the TFTs via a conductive via V5' (i.e., the via portion 148) penetrating the insulating layer 130. The material of the third metal layer M3 or the bridge line BL may be similar to the material of the first metal layer M1, and is therefore not repeated herein. Under the above configuration, the bridge line BL of the third metal layer M3 may be used to input the scan signal or data signal from the scan lines or the data lines to the TFTs, so as to drive the TFTs. In this way, the wiring design of the TFTs, the scan lines, and the data lines may be more marginal.

The insulating layer 140 is disposed on the insulating layer 130 and covers the third metal layer M3 or the bridge line BL. The insulating layer 140 has a plurality of conductive vias penetrating the insulating layer 140.

The second metal layer M2 is disposed on the substrate 100. Specifically, the second metal layer M2 includes the first data line DL1 extended along a first direction (i.e., Y-axis) and an auxiliary scan line AL extended along a second direction (i.e., X-axis) and disposed on the insulating layer 140. As shown in FIG. 2, FIG. 4, and FIG. 5, the first data line DL1 may be electrically connected to the bridge line BL via a conductive via V4 penetrating the insulating layer 140. Thereby, the first data line DL1 may be electrically connected to the TFTs via the bridge line BL to input a data signal. As shown in FIG. 2, FIG. 3, and FIG. 5, the auxiliary scan line AL may include two separate line segments respectively disposed at two opposite sides of the first data line DL1. The auxiliary scan line AL is laterally isolated from the first data line DL. The auxiliary scan line AL may be electrically connected to the bridge line BL via a conductive via V2 penetrating the insulating layer 140. Thereby, the bridge line BL is electrically connected to the two separate line segments of the auxiliary scan line AL, so that the two separate line segments may be disposed across the first data line DL1 via the bridge line BL. In an embodiment of the disclosure, disposed across may be defined as two elements located at different levels in the normal direction of the substrate 100 (i.e., Z-axis) are staggered with each other. For example, the bridge line BL is located under the first data line DL1, and the bridge line BL is extended from a side of the first data line DL1 to the other side. In this way, the two separate line segments of the auxiliary scan line AL may be electrically connected to each other. In addition, the auxiliary scan line AL and the scan lines may be electrically connected to the gate G of the TFTs via the bridge line BL to input the scan signal. In some embodiments, the conductive via connected between the two metal layers may be one or a plurality of densely arranged conductive vias, but the disclosure is not limited thereto. Densely arranged conductive vias may increase the volume of the conductive vias to improve the reliability and electrical quality of the circuit. The material of the second metal layer M2 may be similar to the material of the first metal layer M1, and is therefore not repeated herein.

Please refer to FIG. 5, in some embodiments, the second metal layer M2 may further include a circuit 142 and a conductive via 144. The circuit 142 and the conductive via 144 connected to the circuit 142 may belong to a circuit layer disposed at the insulating layer 140. The circuit 142 is disposed on the surface of the insulating layer 140 to be used as a pad portion, and the conductive via 144 penetrates the insulating layer 140 to electrically connect the circuit 142 to the pad portion of the bridge line BL.

The insulating layer 150 is disposed on the insulating layer 140 and covers the first data line DL1, the auxiliary scan line AL, or a circuit 152 of the second metal layer M2. The insulating layer 150 has a plurality of conductive vias penetrating the insulating layer 150.

The first metal layer M1 is disposed on the substrate 100. Specifically, the first metal layer M1 includes the first connection line CL1 extended along a first direction (i.e., Y-axis) and the second scan line SL2 extended along a second direction (i.e., X-axis) and disposed on the insulating layer 150. In other words, the second metal layer M2 is disposed between the first metal layer M1 and the third metal layer M3. The partially enlarged circuit and the cross-section thereof shown in FIG. 2, FIG. 3, and FIG. 4 are, for example, the circuit in the area B of FIG. 1. The area B shows the wiring structure of the first connection line CL1 staggered with the second scan line SL2. In the third direction (Z-axis), the first connection line CL1 is overlapped with the first data line DL1. In the third direction (Z-axis), the second scan line SL2 is overlapped with the auxiliary scan line AL. The second scan line SL2 includes two separate line segments respectively located at two opposite sides of the first connection line CL1. The second scan line SL2 is laterally isolated from the first connection line CL1. The second scan line SL2 may be electrically connected to the auxiliary scan line AL via the conductive via V1 penetrating the insulating layer 150. Thereby, the second scan line SL2 may be electrically connected to the TFTs via the auxiliary scan line AL and the bridge line BL to input a data signal. In addition, in the third direction (Z-axis), the bridge line BL is overlapped with the second scan line SL2, the first connection line CL1, the first data line DL1, and the auxiliary scan line AL. Under the above configuration, the bridge line BL is disposed across the first connection line CL1 or the first data line DL1. The bridge line BL is electrically connected to two separate line segments of the second scan line SL2 via the conductive via V1, the auxiliary scan line AL, and the conductive via V2, so that the two separate line segments may be disposed across the first data line DL1 and the first connection line CL1 via the bridge line BL.

Referring to FIG. 2 and FIG. 3, in some embodiments, the outer edges of the second scan line SL2 and the auxiliary scan line AL may be aligned. In other words, the second scan line SL2 and the auxiliary scan line AL may be completely overlapped, but the disclosure is not limited thereto. In some embodiments, the second scan line SL2 and the auxiliary scan line AL may be partially overlapped. Under the above configuration, the auxiliary scan line AL may be extended corresponding to the extending direction of the scan line.

The scan line corresponding to the electrical connection of the auxiliary scan line AL may be used to increase the conductive volume of the scan line or reduce the resistance, thereby reducing the impedance and RC loading of the circuit, and improving the electrical quality of the circuit substrate 10.

Please refer to FIG. 2, FIG. 3, and FIG. 5. The conductive via V1 may be overlapped with the conductive via V2. The conductive via V2 may be overlapped with the conductive via V3. The scan line SL (for example, the first scan line SL1 or the second scan line SL2) may be electrically connected to the gate G of the TFTs via the stack of the conductive via V1, the conductive via V2, and the conductive via V3.

Please refer to FIG. 5, the first metal layer M1 may further include the circuit 152 and a conductive via 154. The circuit 152 and the conductive via 154 connected to the circuit 152 may belong to a circuit layer disposed at the insulating layer 150. The circuit 152 is disposed on the surface of the insulating layer 150 to be used as a pad portion, and the conductive via 154 penetrates the insulating layer 150 to electrically connect the circuit 152 to the circuit 142.

The circuit 152 is, for example, applied as a pad at the topmost layer of the circuit substrate 10. For example, the light-emitting elements 300 are disposed on the circuit 152. The light-emitting elements 300 are, for example, light-emitting diode chips, and include an electrode 320, an electrode 340, and a crystal 310. The crystal 310 includes, for example, a first-type semiconductor layer (for example, an N-type doped semiconductor layer), a second-type semiconductor layer (for example, a P-type doped semiconductor layer), and a light-emitting layer located between the first-type semiconductor layer and the second-type semiconductor layer. In other words, the crystal 310 may be a PN light-emitting diode, but the disclosure is not limited thereto. The electrode 320 is electrically connected to the circuit 152 to be connected to the drain D of the TFTs via the bridge line BL. The electrode 340 is electrically connected to a circuit 152' to be connected to a power source or a ground voltage level. Under the above configuration, the electrode 320 is, for example, the positive electrode of the light-emitting elements 300 and the electrode 340 is, for example, the negative electrode. In some embodiments, the light-emitting elements 300 are, for example, flip-chip LEDs, but the disclosure is not limited thereto. In other embodiments, the light-emitting elements 300 include a vertical LED or a front-mounted LED, or other suitable types of LED packages. In this way, the light-emitting elements 300 may be driven by the scan signal of the gate driving circuit 170 via the on/off of the TFTs to display an image.

In some embodiments, a protective layer 190 may be formed after the light-emitting elements 300 are disposed. The protective layer 190 is disposed on the insulating layer 150 and covers the circuit 152, the electrode 320, the electrode 340, and a portion of the sidewall of the crystal 310, but the disclosure is not limited thereto. In some embodiments, the protective layer 190 may also cover the crystal 310 to encapsulate the entire light-emitting elements 300 in the protective layer 190. The protective layer 190 may have an optical function or a protective function, but the disclosure is not limited thereto. The material of the protective layer 180 includes optical adhesive, molding material, epoxy resin, or other transparent materials, but the disclosure is not limited thereto. The protective layer 180 may protect the light-emitting elements 300 and reduce damage to the light-emitting elements 300 caused by external moisture or oxygen.

Please refer to FIG. 6. The cross section shown in FIG. 6 is, for example, a partial enlarged structure of an area A of FIG. 1. The difference between the area A of FIG. 6 and the area B of FIG. 3 is that the first connection line CL1 is connected to the first scan line SL1. Specifically, in the third direction (Z-axis), the first connection line CL1 is overlapped with the first data line DL1. The first scan line SL1 and the first connection line CL1 are, for example, integrally formed and joined, so that the first connection line CL1 is electrically connected to the first scan line SL1. In this way, please refer to FIG. 1 and FIG. 6, the first connection line CL1 extended along the first direction may input the scan signal to the first scan line SL1, and then transmit the scan signal along the first scan line SL1 extended in the second direction.

As shown in FIG. 6, the first scan line SL1 may be electrically connected to the auxiliary scan line AL via a conductive via V6 penetrating the insulating layer 150. The auxiliary scan line AL includes two separate line segments respectively disposed at two opposite sides of the first data line DL1. In the third direction (Z-axis), at least a portion of the auxiliary scan line AL is overlapped with the first scan line SL1. The auxiliary scan line AL may be electrically connected to the bridge line BL via a conductive via V7 penetrating the insulating layer 140. The auxiliary scan line AL is laterally isolated from the first data line DL1. In some embodiments, the auxiliary scan line AL is electrically insulated from the first data line DL1 via the isolation of the insulating layer 150. The connecting portion 146 of the bridge line BL is electrically connected to two separate line segments of the auxiliary scan line AL, so that the auxiliary scan line AL may be disposed across the first data line DL1. The bridge line BL may be electrically connected to the gate G of the TFTs via a conductive via V8 (i.e., the via portion 148 of the bridge line BL) penetrating the insulating layer 120 and the insulating layer 130. Under the above configuration, the first scan line SL1 may be electrically connected to the TFTs via the stack of the bridge line BL and the conductive vias V6, V7, and V8. Thereby, the scan signal may be input to the first scan line SL1 from the first connection line CL1. Then, the scan signal is input to the TFTs via the conductive vias V6, V7, and V8 and the bridge line BL.

It should be mentioned that, the gate driving circuit 170 and the data driving circuit 160 of the circuit substrate 10 of an embodiment of the disclosure may be disposed at the same side of the substrate 100 (for example, the first side 11 close to the display area AA). The gate driving circuit 170 may be connected to the first scan line SL1 extended in the second direction via the first connection line CL1 extended in the first direction, and connected to the second scan line SL2 extended in the second direction via the second connection line CL2 extended in the first direction. The data driving circuit 160 may be connected to the first data line DL1 and the second data line DL2 extended in the first direction. The first scan line SL1 and the second scan line SL2 may receive and transmit a scan signal via the first connection line CL1 and the second connection line CL2, respectively. The first data line DL1 and the second data line DL2 may transmit a data signal. In this way, the scan signal and the data signal may drive the TFTs in the pixel circuit formed by the scan lines and the data lines. The matrix formed by the pixel circuit and the TFTs may drive the connected light-emitting elements 300 based on the scan signal and the data signal, so that the light-emitting elements 300 in the display area AA may display an image. Since the data driving circuit 160 and the gate driving circuit 170 are disposed outside the display area AA, the transmittance of the display area AA of the circuit substrate 10 may be improved or a transparent display technique may be provided. In addition, since the data driving circuit 160 and the gate driving circuit 170 are concentrated at the same side of the circuit substrate 10, the arrangement of the peripheral area BA may be reduced to achieve a narrow frame, a very narrow frame, or a frameless design. In addition, when a plurality of circuit substrates 10 are tiled, a plurality of display areas AA may be tiled adjacently to provide a large display tiling technique with narrow frame, very narrow frame, or borderless tiling. Thereby, the circuit substrate 10 has good display quality or display effect.

In some embodiments, the semiconductor layer SE, the gate G, and the source S or the drain D of the TFTs may be disposed in an overlapping manner with the first scan line SL1, the second scan line SL2, the first data line DL1, or the bridge line BL. In this way, the TFTs may be integrated into the pixel circuit to reduce the need to additionally provide a light-shielding layer. Thereby, the transmittance of the display area AA of the circuit substrate 10 may be increased. The circuit substrate 10 may have good display quality or display effect.

Other embodiments are listed below for description. It should be noted here that the following embodiments adopt the reference numerals and part of the content of the above embodiments, wherein the same reference numerals are used to represent the same or similar elements, and the description of the same technical content is omitted. For the description of the omitted parts, reference may be made to the above embodiments, which is not repeated in the following embodiments.

Figure 7:
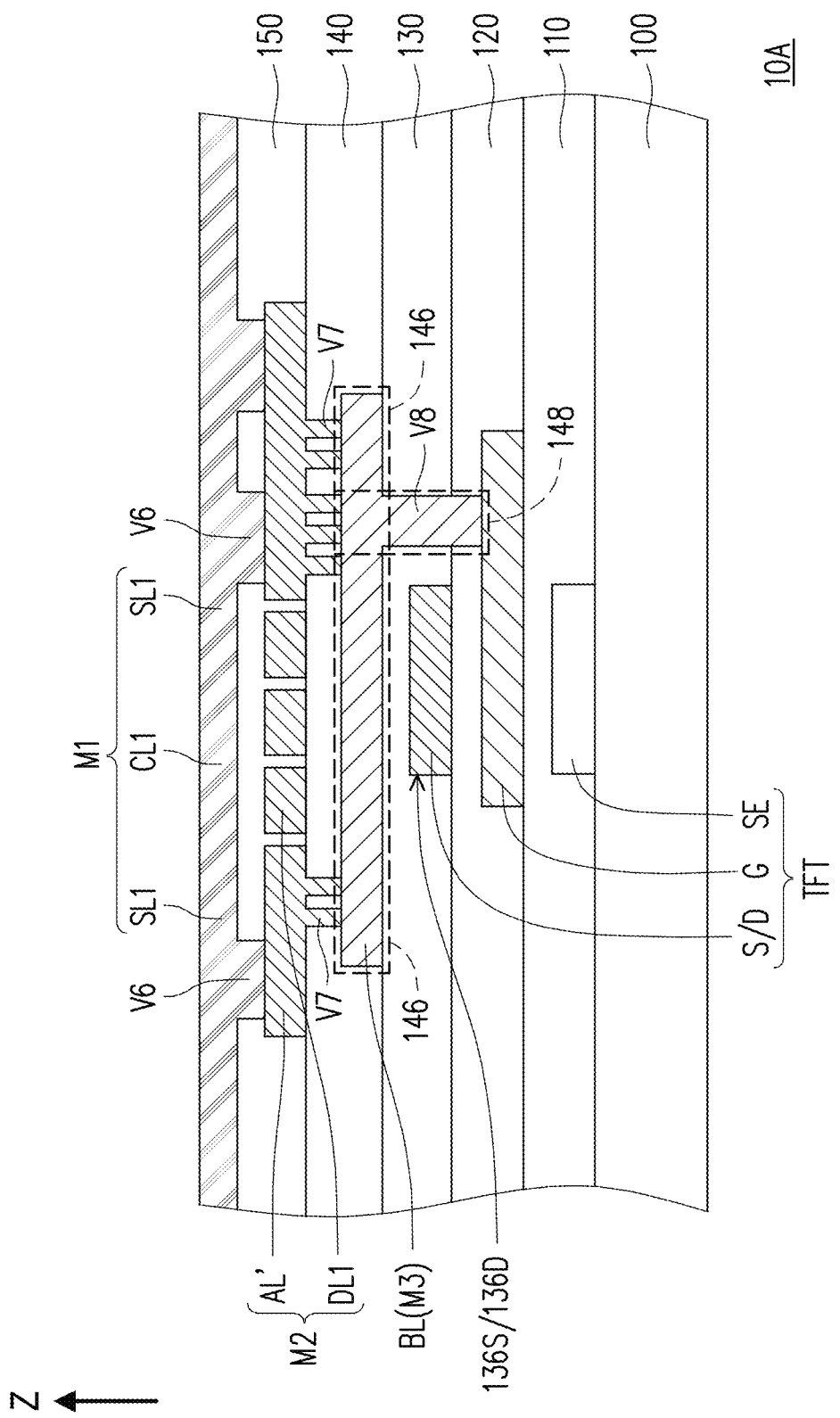
FIG. 7 is a schematic cross-sectional view of a circuit substrate of another embodiment of the disclosure.

FIG. 7 is a schematic cross-sectional view of a circuit substrate of another embodiment of the disclosure. For clarity of the drawings and convenience of description, several elements are omitted in FIG. 7. A circuit substrate 10A of the present embodiment is substantially similar to the circuit substrate 10 of FIG. 6, so the same and similar components in the two embodiments are not repeated herein. The present embodiment is different from the circuit substrate 10 mainly in that the second metal layer M2 includes an auxiliary scanning pattern AL'. The auxiliary scanning pattern AL' is a pattern formed by patterning the second metal layer M2, and a portion of the pattern thereof is overlapped with the first scan line SL1 and is not extended in the second direction (X-axis) like the first scan line SL1. The auxiliary scanning pattern AL' is disposed between the first scan line SL1 and the bridge line BL for switching circuits at different levels, so that the scan line and the bridge line BL are designed with margin. In other words, the auxiliary scanning pattern AL' is a pattern disposed close to the conductive via V6 and the conductive via V7, rather than being overlapped along the extending direction of the first scan line SL1. With the above configuration, the circuit substrate 10A may obtain excellent technical effects similar to those of the above embodiments.

FIG. 8 is a schematic top view of a tiled electronic device of an embodiment of the disclosure. For clarity of the drawings and convenience of description, several elements are omitted in FIG. 8. The tiled electronic device 1 is, for example, a large tiled display device adopting a tiling technique. The tiled electronic device may include a tiled panel, an outdoor large display, or any device including an image display function, but the disclosure is not limited thereto. The tiled electronic device 1 includes a plurality of circuit substrates. Each of the circuit substrates includes a display area AA and a peripheral area BA located at one of the sides of the display area. The display area AA is provided with a pixel circuit or a matrix, and a plurality of light-emitting elements (for example, the light-emitting elements 300) for displaying an image. Data driving circuits 160' and 160" and gate driving circuits 170' and 170" are disposed in the peripheral area BA to provide a data signal and a scan signal to the TFTs in the matrix, respectively. Thereby, the light-emitting elements are driven to display an image in the display area AA.

In detail, the plurality of circuit substrates of the tiled electronic device 1 at least include a circuit substrate 10' and a circuit substrate 10". The circuit substrate 10' and the circuit substrate 10" are tiled to each other to form a pair of tiled circuit substrates. The data driving circuit 160' and the gate driving circuit 170' of the circuit substrate 10' are disposed in the peripheral area BA. The data driving circuit 160" and the gate driving circuit 170" of the circuit substrate 10" are disposed in the peripheral area BA. The display area AA of the circuit substrate 10' is adjacent to the display area AA of the circuit substrate 10", and therefore the circuit substrate 10' and the circuit substrate 10" are tiled at a side of the display area AA relative to the peripheral area BA. Under the above configuration, the display area AA of the circuit substrate 10' and the display area AA of the circuit substrate 10" are located between the peripheral area BA of the circuit substrate 10' and the peripheral area BA of the circuit substrate 10".

Similar to the above pair of tiled circuit substrate 10' and circuit substrate 10", a plurality of pairs of tiled circuit substrates may be tiled in the second direction (X-axis). Taking FIG. 8 as an example, a total of three pairs of circuit substrates may be disposed in the second direction, two circuit substrates may be tiled in the first direction (Y-axis), and three circuit substrates may be tiled in the second direction. Thereby, the tiled electronic device 1 formed by tiling 2×3 circuit substrates is formed. In another embodiment, two circuit substrates may be tiled in the second direction, and three circuit substrates may be tiled in the first direction. Thereby, a tiled electronic device formed by tiling 3×2 circuit substrates is formed.

Under the above configuration, the tiled electronic device 1 is configured to tile a plurality of paired circuit substrates in a manner of 2 times an N number, for example. Therefore, a number of the plurality of circuit substrates is 2 times N, and N is a positive integer. Taking FIG. 8 as an example, N may be 3, so that an arrangement method of a total of 6 circuit substrates of 2×3 may be achieved. In other embodiments, N may be a positive integer of 1, 2, 3, 4, 5, or greater. In this way, a tiled electronic device formed by dozens, tens, or hundreds of circuit substrates may be tiled together. Based on the above, when the plurality of circuit substrates 10' and 10" are tiled, a plurality of display areas AA may be tiled adjacently to provide a large display tiling technique of a narrow border, very narrow border, or borderless tiling. Thereby, the tiled electronic device 1 formed by tiling the plurality of circuit substrates 10' and 10" has good display quality or display effect.

Based on the above, in the tiled electronic device formed by tiling a circuit substrate and a plurality of circuit substrates according to an embodiment of the disclosure, the gate driving circuit and the data driving circuit of the circuit substrate may be disposed at the same side of the substrate. Moreover, the gate driving circuit may respectively input the provided scan signal to the first scan line and the second scan line via the first connection line and the second connection line. The data driving circuit may input the provided data signal to the first data line and the second data line. In this way, the gate driving circuit providing the scan signal and the data driving circuit providing the data signal may be centrally disposed in the peripheral area at the same side of the substrate. Therefore, the transmittance of the display area of the circuit substrate may be improved or a transparent display technique may be provided. In addition, since the driving circuits are concentrated at the same side of the circuit substrate, when a plurality of circuit substrates are tiled, a plurality of display areas may be tiled adjacently to provide a large display tiling technique with narrow frame, very narrow frame, or borderless tiling. Thereby, the circuit substrate and the tiled electronic device formed by tiling a plurality of circuit substrates have good display quality or display effect.

Lastly, it should be noted that the above embodiments are used to describe the technical solution of the disclosure instead of limiting it. Although the disclosure has been described in detail with reference to each embodiment above, those having ordinary skill in the art should understand that the technical solution recited in each embodiment above may still be modified, or some or all of the technical features thereof may be equivalently replaced. These modifications or replacements do not make the essence of the corresponding technical solutions depart from the scope of the technical solution of each embodiment of the disclosure.

What is claimed is:

1. A circuit substrate, comprising:
   a substrate;
   a first metal layer disposed on the substrate, wherein the first metal layer comprises a first connection line and a second connection line extended along a first direction, and a first scan line and a second scan line extended along a second direction, the first connection line is electrically connected to the first scan line, and the second connection line is electrically connected to the second scan line, wherein the second scan line comprises two separate line segments respectively located at two opposite sides of the first connection line;
   a second metal layer disposed on the substrate, wherein the second metal layer comprises:
      a plurality of data lines extended along the first direction, and the plurality of data lines are overlapped with the first connection line; and
      an auxiliary scan line extended along the second direction, and the auxiliary scan line is electrically connected to the second scan line; and
   a third metal layer disposed on the substrate, wherein the third metal layer comprises a bridge line extended along the second direction, and the bridge line is electrically connected to the two separate line segments of the second scan line;
   wherein the second metal layer is disposed between the first metal layer and the third metal layer.

2. The circuit substrate of claim 1, further comprising a gate driving circuit, wherein the gate driving circuit is electrically connected to the first scan line and the second scan line via the first connection line and the second connection line, respectively.

3. The circuit substrate of claim 2, wherein the gate driving circuit inputs a scan signal to the first scan line and the second scan line via the first connection line and the second connection line, respectively.

4. The circuit substrate of claim 2, further comprising a data driving circuit, wherein the data driving circuit is electrically connected to the plurality of data lines to input a data signal to the plurality of data lines.

5. The circuit substrate of claim 4, wherein the gate driving circuit and the data driving circuit are disposed at a same side of the substrate.

6. The circuit substrate of claim 4, wherein the circuit substrate comprises a peripheral area and a display area, and the peripheral area is located at a side of the display area.

7. The circuit substrate of claim 4, wherein the gate driving circuit is disposed between the data driving circuit and the display area.

8. The circuit substrate of claim 1, wherein the first scan line is electrically connected to the auxiliary scan line via a first conductive via.

9. The circuit substrate of claim 8, wherein the auxiliary scan line is overlapped with the first scan line, and the auxiliary scan line is electrically insulated from the plurality of data lines.

10. The circuit substrate of claim 8, wherein the auxiliary scan line is electrically connected to the bridge line via a second conductive via.

11. The circuit substrate of claim 8, wherein the second scan line is electrically connected to the auxiliary scan line via a third conductive via.

12. The circuit substrate of claim 1, wherein the bridge line is overlapped with the second scan line and the first connection line, and the bridge line is disposed across the first connection line or the plurality of data lines.

13. The circuit substrate of claim 1, further comprising a thin-film transistor, wherein the thin-film transistor comprises a semiconductor layer, a gate, a source, and a drain.

14. The circuit substrate of claim 13, further comprising a fourth metal layer and a fifth metal layer, wherein the source and the drain are patterns formed by patterning the fourth metal layer, and the gate is a pattern formed by patterning the fifth metal layer, wherein the gate and the second scan line belong to different layers, the second scan line overlaps the gate, and the second scan line is electrically connected to the gate.

15. The circuit substrate of claim 13, wherein the bridge line is electrically connected to the thin-film transistor via a fourth conductive via.

16. A tiled electronic device, comprising:
    a plurality of the circuit substrate of claim 1, wherein the plurality of circuit substrates are tiled with each other, wherein a number of the plurality of circuit substrates is 2 times N, and N is a positive integer.

17. The tiled electronic device of claim 16, wherein each of the plurality of circuit substrates has a peripheral area and a display area, and a plurality of the display area are located between a plurality of the peripheral area,
    wherein each of the plurality of circuit substrates comprises a gate driving circuit and a data driving circuit disposed in the peripheral area.

18. The tiled electronic device of claim 17, wherein the peripheral area is located at at least one side of the display area.

19. The tiled electronic device of claim 17, wherein the gate driving circuit is disposed between the data driving circuit and the display area.

20. The circuit substrate of claim 1, wherein a sum of widths of the plurality of data lines is smaller than a width of the first connection line.

* * * * *